United States Patent
Kudelka et al.

(10) Patent No.: US 7,273,790 B2
(45) Date of Patent: Sep. 25, 2007

(54) METHOD FOR FABRICATING TRENCH CAPACITOR WITH INSULATION COLLAR ELECTRICALLY CONNECTED TO SUBSTRATE THROUGH BURIED CONTACT, IN PARTICULAR, FOR A SEMICONDUCTOR MEMORY CELL

(75) Inventors: Stephan Kudelka, Ottendorf-Okrilla (DE); Martin Popp, Dresden (DE); Harald Seidl, Poering (DE); Annette Sänger, Dresden (DE)

(73) Assignee: Infineon Technologies AG, Munich (DE)

( * ) Notice: Subject to any disclaimer, the term of this patent is extended or adjusted under 35 U.S.C. 154(b) by 113 days.

(21) Appl. No.: 10/901,406

(22) Filed: Jul. 27, 2004

(65) Prior Publication Data

US 2005/0026384 A1    Feb. 3, 2005

(30) Foreign Application Priority Data

Jul. 29, 2003    (DE)    ................. 103 34 547

(51) Int. Cl.
    *H01L 21/20*    (2006.01)
(52) U.S. Cl. ................. 438/386; 257/301; 438/391
(58) Field of Classification Search ................. 257/68; 438/243, 386
    See application file for complete search history.

(56) References Cited

U.S. PATENT DOCUMENTS

| | | | |
|---|---|---|---|
| 5,670,805 A * | 9/1997 | Hammerl et al. | 257/301 |
| 5,945,704 A * | 8/1999 | Schrems et al. | 257/301 |
| 6,312,982 B1 * | 11/2001 | Takato et al. | 438/238 |
| 6,331,459 B1 * | 12/2001 | Gruening | 438/243 |
| 6,372,573 B2 * | 4/2002 | Aoki et al. | 438/248 |
| 6,410,391 B1 * | 6/2002 | Zelsacher | 438/259 |
| 6,498,061 B2 | 12/2002 | Divakaruni et al. | |
| 6,500,707 B2 * | 12/2002 | Schrems | 438/249 |
| 6,528,384 B2 * | 3/2003 | Beckmann et al. | 438/386 |
| 6,548,850 B1 * | 4/2003 | Gernhard et al. | 257/301 |
| 6,569,751 B1 * | 5/2003 | Tripathi et al. | 438/572 |
| 6,613,647 B2 * | 9/2003 | Kim | 438/424 |
| 2002/0132421 A1 * | 9/2002 | Schrems | 438/241 |
| 2004/0063321 A1 | 4/2004 | Goebel et al. | |

FOREIGN PATENT DOCUMENTS

| | | |
|---|---|---|
| DE | 101 15 912 A1 | 10/2002 |
| DE | 102 05 077 A1 | 8/2003 |
| WO | 03/067596 A2 | 8/2003 |

* cited by examiner

*Primary Examiner*—Carl Whitehead, Jr.
*Assistant Examiner*—Colleen E. Rodgers
(74) *Attorney, Agent, or Firm*—Laurence A. Greenberg; Werner H. Stemer; Ralph E. Locher

(57) ABSTRACT

Fabricating a trench capacitor with an insulation collar in a substrate, which is electrically connected thereto on one side through a buried contact, in particular, for a semiconductor memory cell with a planar selection transistor in the substrate and connected through the buried contact, includes providing a trench using an opening in a hard mask, providing a capacitor dielectric in lower and central trench regions, the collar in central and upper trench regions, and a conductive filling at least as far as the insulation collar topside, completely filling the trench with a filling material, carrying out STI trench fabrication process, removing the filling material and sinking the filling to below the collar topside, forming an insulation region on one side above the collar; uncovering a connection region on a different side above the collar, and forming the buried contact by depositing and etching back a metallic filling.

13 Claims, 21 Drawing Sheets

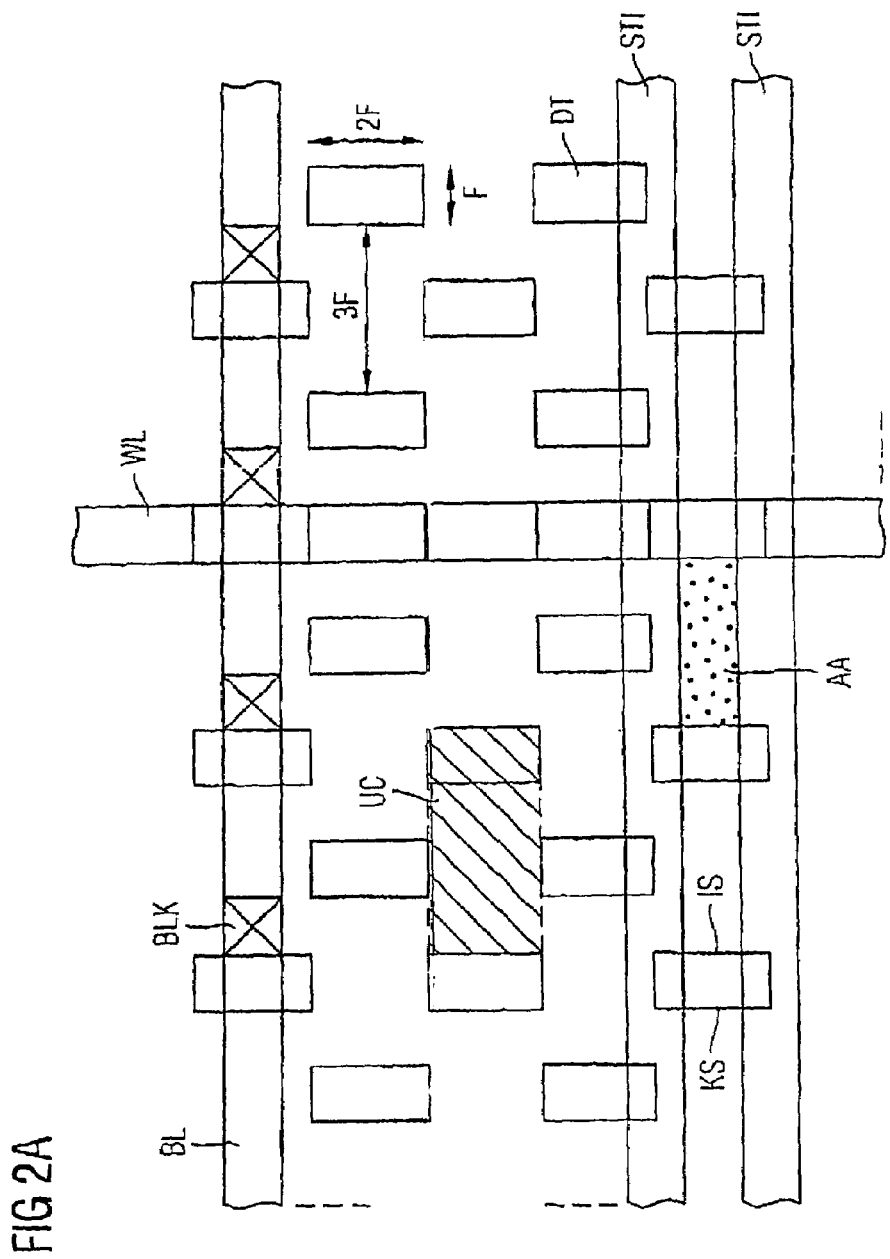

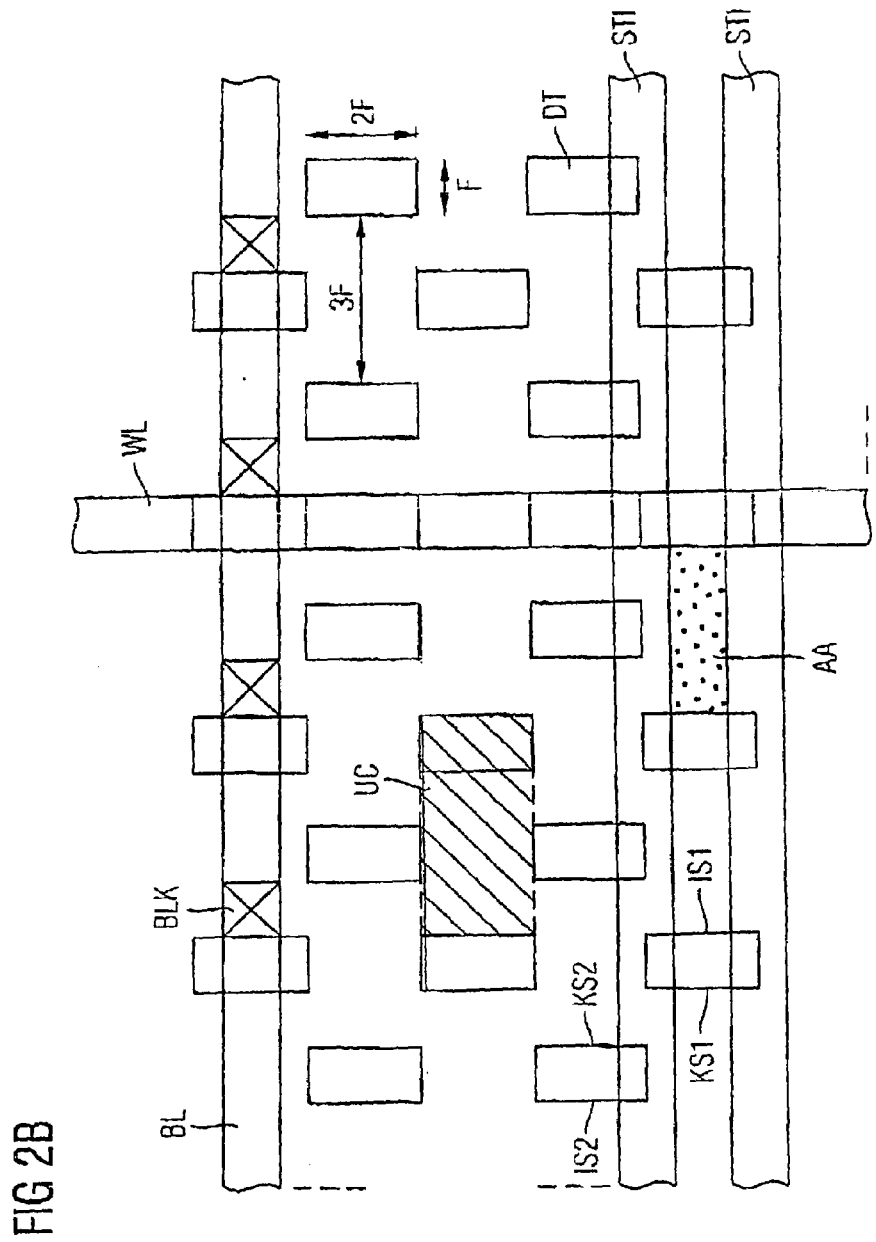

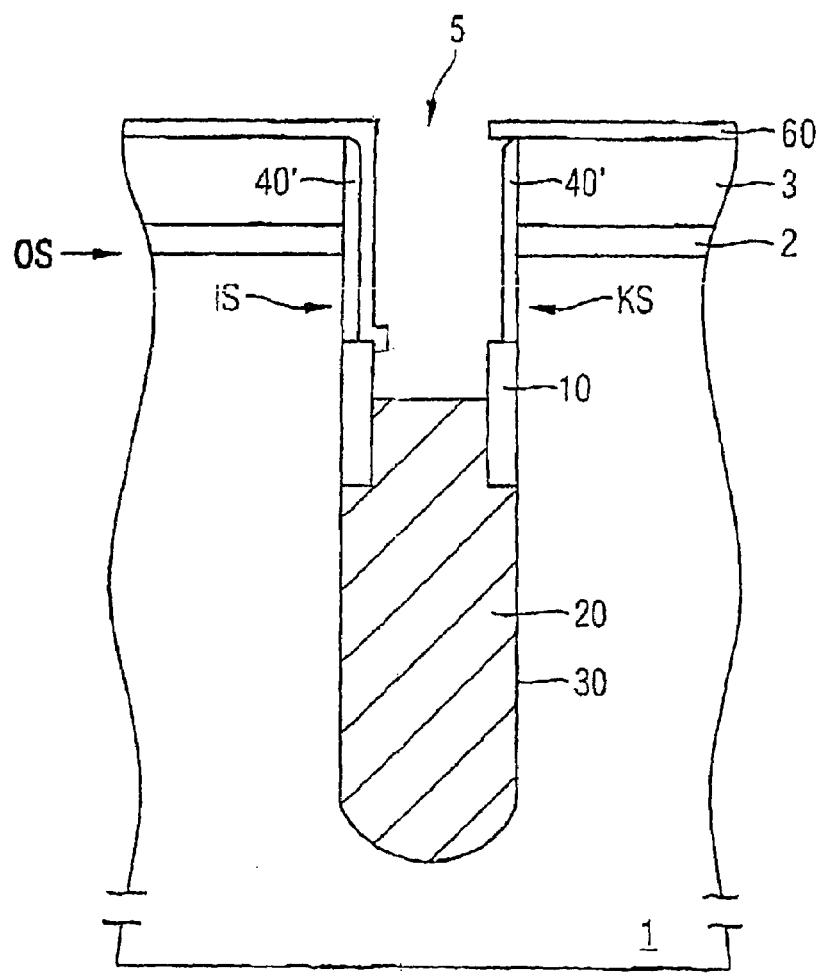

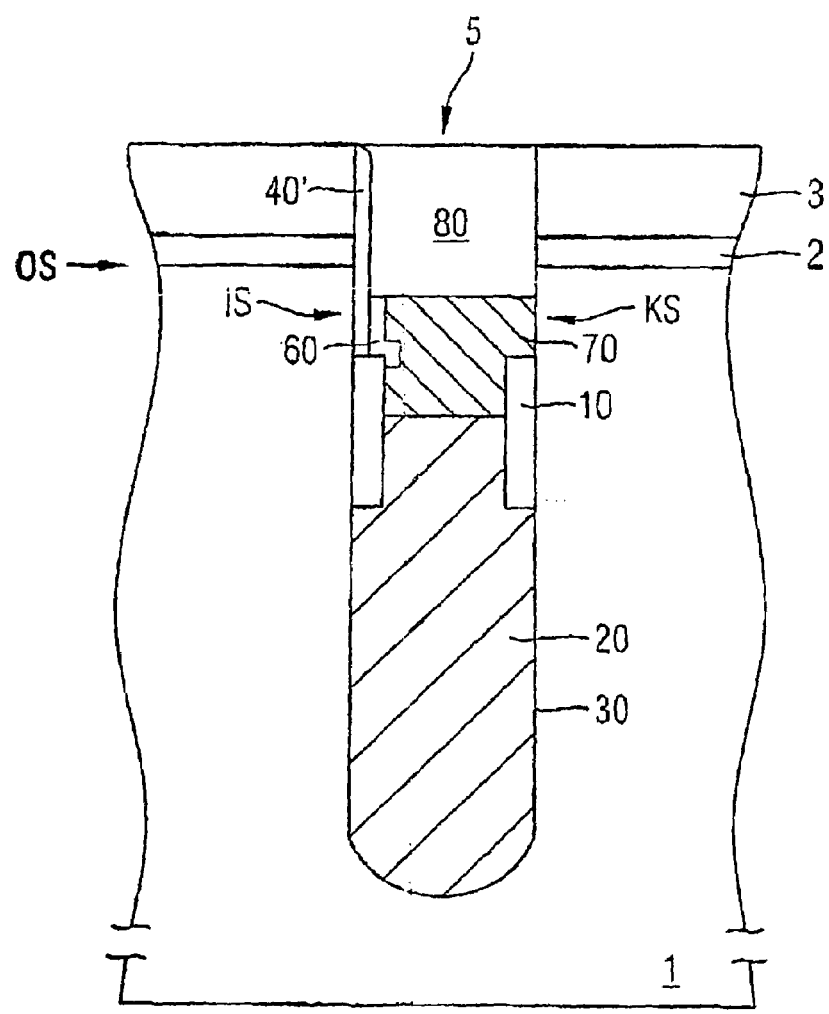

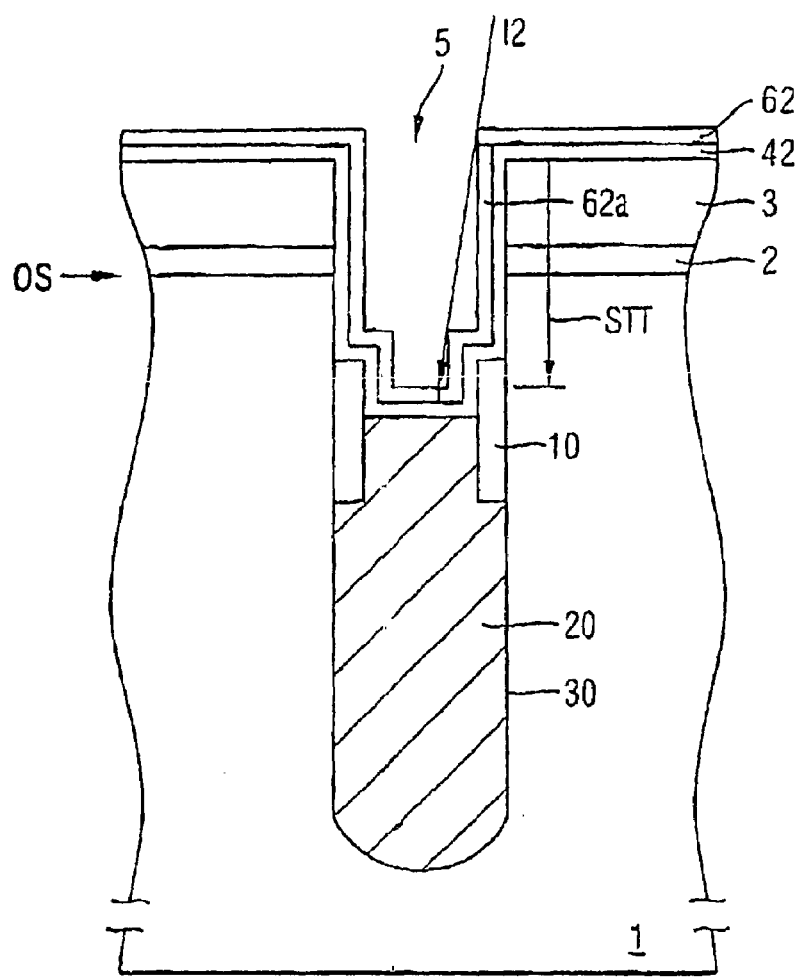

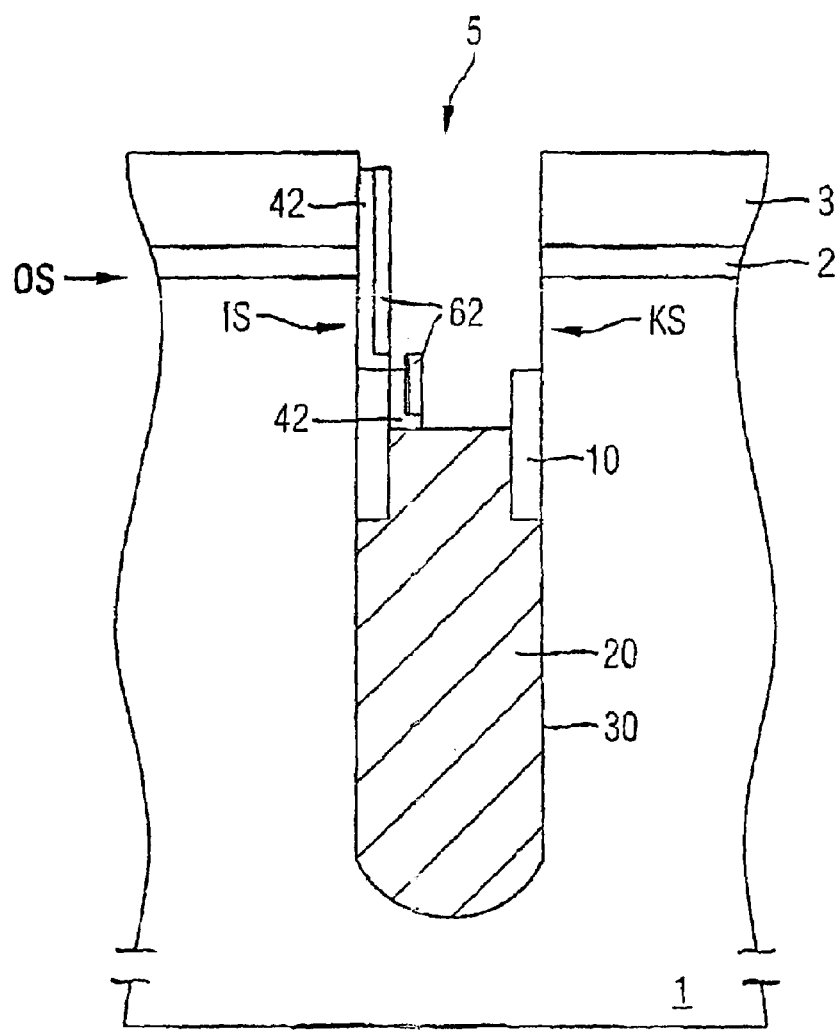

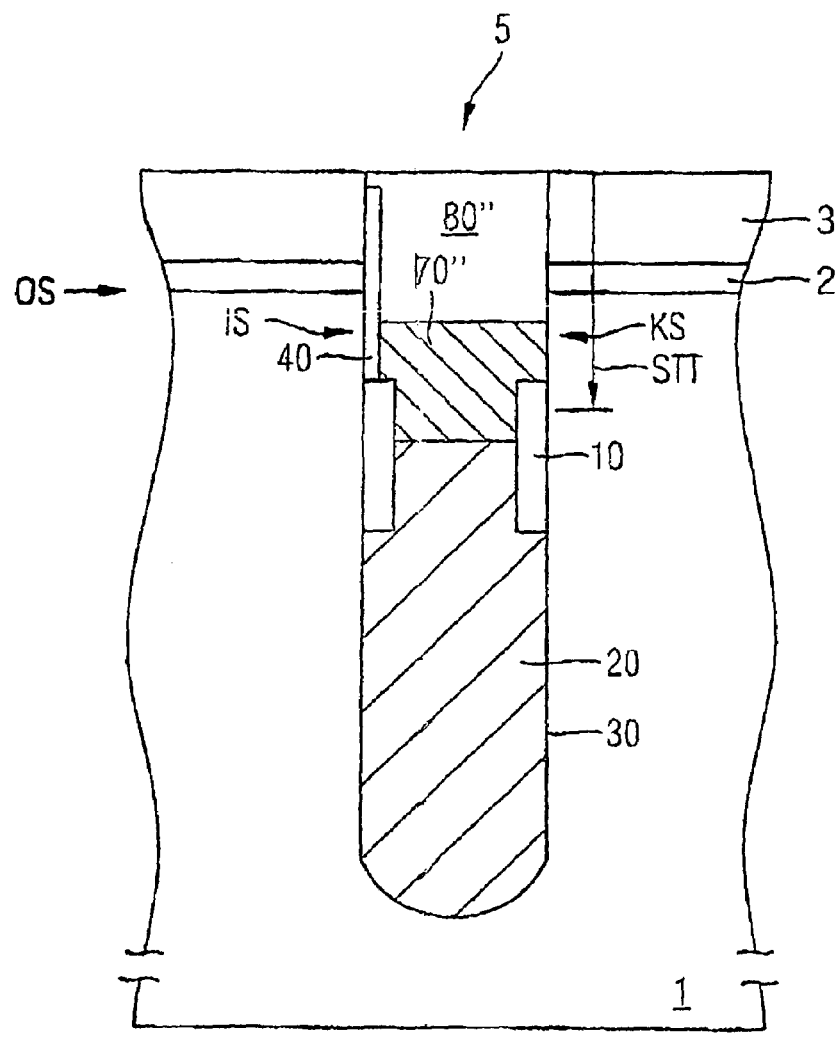

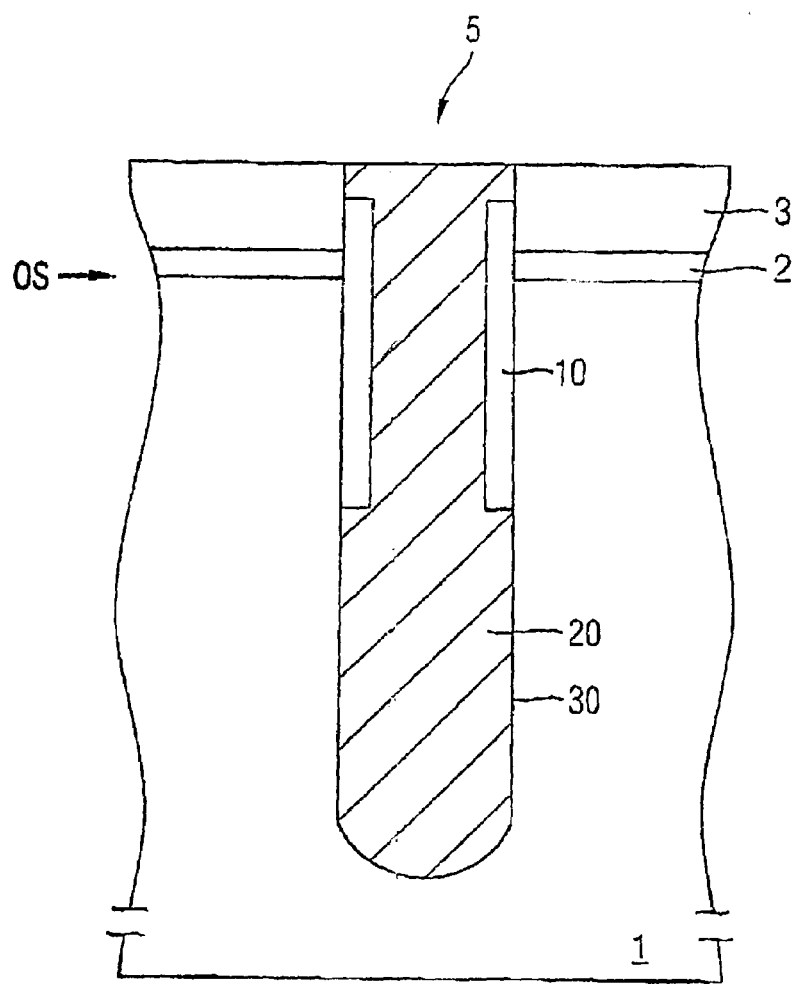

METHOD FOR FABRICATING TRENCH CAPACITOR WITH INSULATION COLLAR ELECTRICALLY CONNECTED TO SUBSTRATE THROUGH BURIED CONTACT, IN PARTICULAR, FOR A SEMICONDUCTOR MEMORY CELL

BACKGROUND OF THE INVENTION

Field of the Invention

The present invention provides a method for fabricating a trench capacitor with an insulation collar that is electrically connected to a substrate on one side through a buried contact, in particular, for a semiconductor memory cell.

Although applicable, in principle, to any desired integrated circuits, the present invention and the problem area on which it is based are explained with regard to integrated memory circuits in silicon technology.

FIG. 1 shows a diagrammatic sectional illustration of a semiconductor memory cell with a trench capacitor and a planar selection transistor connected thereto.

In FIG. 1, reference symbol 1 designates a silicon semiconductor substrate. Provided in the semiconductor substrate 1 are trench capacitors GK1, GK2 having trenches G1, G2, the electrically conductive fillings 20a, 20b of which form first capacitor electrodes. The conductive fillings 20a, 20b are insulated in the lower and central trench region by a dielectric 30a, 30b from the semiconductor substrate 1, which, for its part, forms the second capacitor electrodes (if appropriate in the form of a non-illustrated buried plate).

Provided in the central and upper region of the trenches G1, G2 are peripheral insulation collars 10a, 10b, above which are provided buried contacts 15a, 15b, which are in electrical contact with the conductive fillings 20a, 20b and the adjoining semiconductor substrate 1. The buried contacts 15a, 15b are connected to the semiconductor substrate 1 only on one side (cf. FIGS. 2a, 2b). Insulation regions 16a, 16b insulate the other side of the substrate from the buried contacts 15a, 15b or insulate the buried contacts 15a, 15b toward the topside of the trenches G1, G2.

The configuration enables a very high packing density of the trench capacitors GK1, GK2 and of the associated selection transistors, which will now be explained. In this case, reference is made principally to the selection transistor that is associated with the trench capacitor GK2, since only the drain region D1 or the source region S3, respectively, of adjacent selection transistors is depicted. The selection transistor associated with the trench capacitor GK2 has a source region S2, a channel region K2, and a drain region D2. The source region S2 is connected through a bit line contact BLK to a bit line (not shown) disposed above an insulation layer I. The drain region D2 is connected to the buried contact 15b on one side. A word line WL2 having a gate stack GS2 and a gate insulator GI2 surrounding the latter runs above the channel region K2. The word line WL2 is an active word line for the selection transistor of the trench capacitor GK2.

Running parallel adjacent to the word line WL2 are word lines WL1 including gate stack GS1 and gate insulator GI1 and word line WL3 including gate stack GS3 and gate insulator GI3, which are passive word lines for the selection transistor of the trench capacitor GK2. The word lines WL1, WL3 serve for driving selection transistors displaced in the third dimension with respect to the sectional illustration shown.

FIG. 1 illustrates the fact that this type of connection on one side of the buried contact enables the trenches and the adjacent source regions or drain regions of relevant selection transistors to be disposed directly beside one another. As a result, the length of a memory cell may amount to just 4 F and the width to just 2 F, where F is the minimum length unit that can be realized technologically (cf. FIGS. 2a, 2b).

FIG. 2A shows a plan view of a memory cell array with memory cells in accordance with FIG. 1 in a first configuration possibility.

Reference symbol DT in FIG. 2A designates trenches that are disposed rowwise at a distance of 3 F from one another and columnwise at a distance of 2 F. Adjacent rows are displaced by 2 F relative to one another. UC in FIG. 2A designates the area of a unit cell, which amounts to 4 F×2 F=8 $F^2$. STI designates isolation trenches that are disposed at a distance of 1 F from one another in the row direction and insulate adjacent active regions from one another. Bit lines BL likewise run at a distance of 1 F from one another in the row direction, whereas the word lines run at a distance of 1 F from one another in the column direction. In this configuration example, all the trenches DT have a contact region KS of the buried contact to the substrate on the left-hand side and an insulation region IS on the right-hand side (regions 15a, 15b and 16a, 16b, respectively, in FIG. 1).

FIG. 2B shows a plan view of a memory cell array with memory cells in accordance with FIG. 1 in a second configuration possibility.

In this second configuration possibility, the rows of trenches have alternating connection regions and insulation regions of the buried contacts, respectively. Thus, in the bottom-most row of FIG. 2B, the buried contacts are in each case provided with a contact region KS1 on the left-hand side and with an insulation region IS1 on the right-hand side. By contrast, in the row located above that, all the trenches DT are provided with each insulation region IS2 on the left-hand side and with a contact region KS2 on the right-hand side. This configuration alternates in the column direction.

For DRAM memory devices with trench capacitors in sub-100 nm technologies, the resistance of the trench and of the buried contact are the main contribution to the total RC delay, and, thus, determine the speed of the DRAM. The relatively low conductivity and the pinch-off, which is produced by an overlay displacement of the STI etching, results in a dramatic increase in the series resistance in the trench.

This problem has been tackled by introducing polysilicon that is highly doped with arsenic, improving the overlay between the active regions of the trench, introducing self-aligned fabrication of a buried contact with a connection on one side and thinning the nitrided contact point of the buried contact.

SUMMARY OF THE INVENTION

It is accordingly an object of the invention to provide a method for fabricating a trench capacitor with an insulation collar which is electrically connected to a substrate on one side through a buried contact, in particular for a semiconductor memory cell, that overcomes the hereinafore-mentioned disadvantages of the heretofore-known devices and methods of this general type and that improves methods for fabricating a trench capacitor connected on one side and that has a shorter RC delay.

With the foregoing and other objects in view, there is provided, in accordance with the invention, a method for fabricating a trench capacitor in a substrate, including the steps of providing a trench in the substrate utilizing a hard mask with a corresponding mask opening, the trench having the lower, central, and upper trench regions, providing a capacitor dielectric in the lower and central trench regions, providing an insulation collar in the central and upper trench regions, the insulation collar having a topside, providing an electrically conductive filling at least as far as the topside of the insulation collar, completely filling the trench with a filling material, carrying out an STI trench fabrication process, removing the filling material and sinking the electrically conductive filling to below the topside of the insulation collar, forming an insulation region on a first side with respect to the substrate above the insulation collar, uncovering a connection region on a different side with respect to the substrate above the insulation collar, and forming a buried contact electrically connecting the filling of the trench to the substrate on one side of the trench by depositing and etching back a metallic filling.

The central idea of the present invention exists in providing a process in which a metallic, oxidation-sensitive buried contact can be used in order to reduce the contact resistance at the contact area. The metal filling and etching-back after the STI formation (STI=shallow trench isolation) is, in particular, integrated into the method according to the invention and, thus, enables the formation of a functional buried metallic contact connected on one side.

In accordance with another feature of the invention, after the metallic filling has been etched back, an insulation cover is provided in the upper trench region at least as far as the topside of the substrate.

In accordance with a further feature of the invention, the filling is provided as far as the topside of the insulation collar, then, a nitride liner layer is deposited and, then, the trench is completely filled with the filling material.

In accordance with an added feature of the invention, after the removal of the filling material, spacers are formed at the trench walls above the insulation collar and the spacer lying above the connection region is removed, the spacer lying above the insulation region being masked with a silicon liner.

In accordance with an additional feature of the invention, the filling is provided as far as the topside of the insulation collar and the trench is, then, completely filled with the filling material.

In accordance with yet another feature of the invention, after the removal of the filling material, a nitride liner layer is deposited, and a silicon liner layer is deposited, then, a spacer is formed from the silicon liner layer above the nitride liner layer in the insulation region and the nitride liner layer lying above the connection region is removed, the nitride liner layer lying above the insulation region being masked with the spacer made from the silicon liner layer.

In accordance with yet a further feature of the invention, the filling is provided as far as the topside of the insulation collar, then, a nitride liner layer is deposited, then, a first silicon liner layer is deposited, then, a spacer is formed from the silicon liner layer in the insulation region (IS), then, a second nitride liner layer is deposited and, then, the trench is completely filled with the filling material.

In accordance with yet an added feature of the invention, after the removal of the filling material, the first and second nitride liner layers are removed apart from a region that is masked by the spacer made from the silicon liner layer.

In accordance with yet an additional feature of the invention, the filling is provided as far as the topside of the hard mask and the insulation collar is provided as far as above the topside of the substrate.

In accordance with again another feature of the invention, the filling material is removed as far as the topside of the substrate, then, a silicon liner layer is deposited and is removed on the side of the contact region, then, the insulation collar is sunk in the upper trench region, and, then, the filling is sunk to below the topside of the sunk part of the insulation collar.

In accordance with again a further feature of the invention, the metallic filling includes TiN. TiN is preferably proposed as metal filling due to its superior thermal stability in contact with Si and $SiO_2$.

In accordance with again an added feature of the invention, a semiconductor memory cell having a planar selection transistor is provided in the substrate and the buried contact is electrically connected to the selection transistor and/or to to the memory cell.

In accordance with again an additional feature of the invention, a plurality of semiconductor memory cells each having a planar selection transistor are provided in the substrate, a plurality of the trench capacitor is provided in the substrate to form a trench capacitor array, and each buried contact of a trench capacitor is electrically connected to one of the memory cells.

With the objects of the invention in view, there is also provided a method for fabricating a memory cell array having trench capacitors in a substrate, including providing a plurality of semiconductor memory cells each having a planar selection transistor in the substrate and providing each of the trench capacitors in the substrate by providing a trench in the substrate utilizing a hard mask with a corresponding mask opening, the trench having the lower, central, and upper trench regions, providing a capacitor dielectric in the lower and central trench regions, providing an insulation collar in the central and upper trench regions, the insulation collar having a topside, providing an electrically conductive filling at least as far as the topside of the insulation collar, completely filling the trench with a filling material, carrying out an STI trench fabrication process, removing the filling material and sinking the electrically conductive filling to below the topside of the insulation collar, forming an insulation region on a first side with respect to the substrate above the insulation collar, uncovering a connection region on a different side with respect to the substrate above the insulation collar, and forming a buried contact electrically connecting the filling of the trench to the substrate and to a respective one of the memory cells on one side of the trench by depositing and etching back a metallic filling.

Other features that are considered as characteristic for the invention are set forth in the appended claims.

Although the invention is illustrated and described herein as embodied in a method for fabricating a trench capacitor with an insulation collar that is electrically connected to a substrate on one side through a buried contact, in particular for a semiconductor memory cell, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2A is a fragmentary, diagrammatic, plan view of a first embodiment a memory cell array according to the invention with memory cells of FIG. 1;

FIG. 2B is a fragmentary, diagrammatic, plan view of a second embodiment a memory cell array according to the invention with memory cells of FIG. 1;

FIGS. 3A to 3F are fragmentary, diagrammatic, cross-sectional views of successive method stages of a first embodiment of a fabrication method according to the invention;

FIGS. 4A to 4E are fragmentary, diagrammatic, cross-sectional views of successive method stages of a second embodiment of a fabrication method according to the invention;

FIGS. 5A to 5C are fragmentary, diagrammatic, cross-sectional views of successive method stages of a third embodiment of a fabrication method according to the invention; and FIGS. 6A to 6D are fragmentary, diagrammatic, cross-sectional views of successive method stages of a fourth embodiment of a fabrication method according to the invention.

DESCRIPTION OF THE PREFERRED EMBODIMENTS

In the figures of the drawings, unless stated otherwise, identical reference symbols denote identical parts.

In the embodiments described below, for reasons of clarity, a portrayal of the fabrication of the planar selection transistors is dispensed with and only the formation of the buried contact of the trench capacitor, which buried contact is connected on one side, is discussed in detail. Unless expressly mentioned otherwise, the steps of fabricating the planar selection transistors are the same as in the prior art.

Referring now to the figures of the drawings in detail and first, particularly to FIGS. 3A to 3F thereof, there are shown diagrammatic illustrations of successive method stages of a fabrication method as first embodiment of the present invention.

Figure 1:
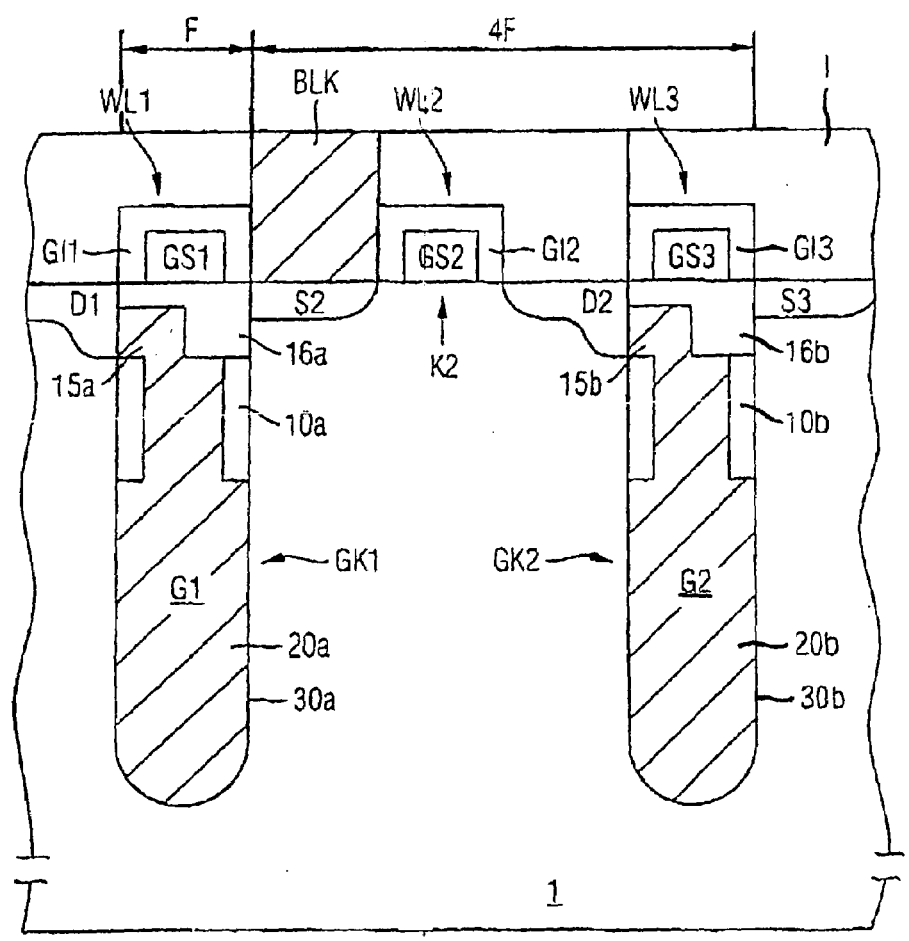
FIG. 1 is a fragmentary, diagrammatic, cross-sectional view of a semiconductor memory cell with a trench capacitor according to the invention and a planar selection transistor connected thereto.
Figure 3A:
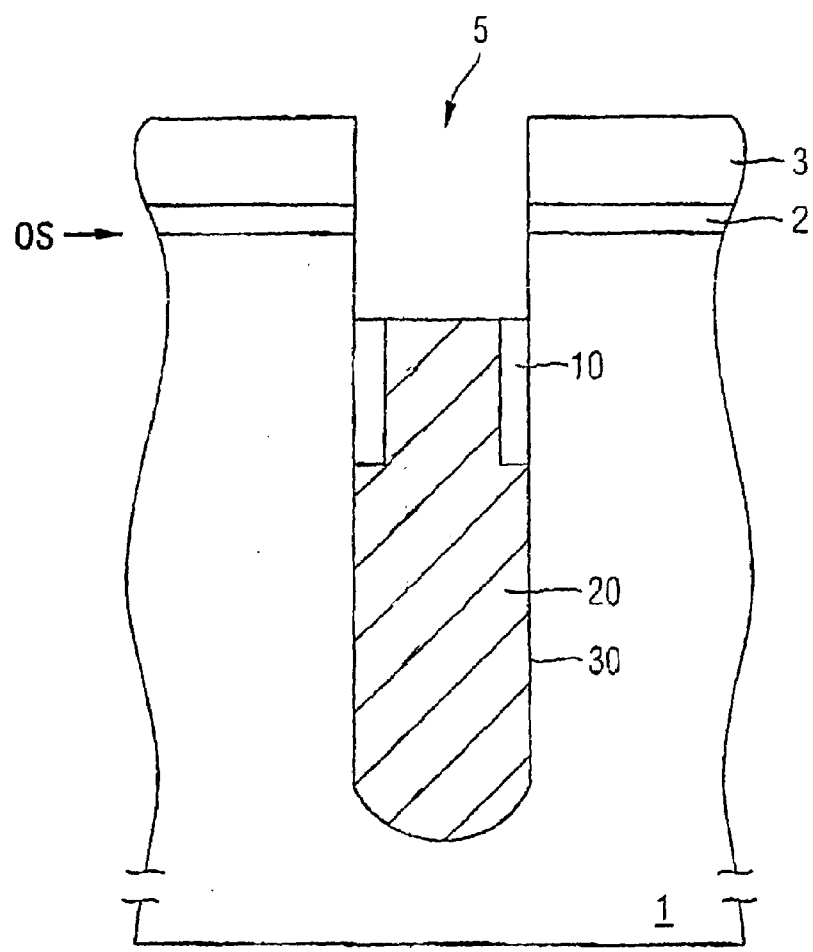

In FIG. 3A, reference symbol 5 designates a trench provided in the silicon semiconductor substrate 1. Provided on the topside OS of the semiconductor substrate 1 is a hard mask including a pad oxide layer 2 and a pad nitride layer 3. A dielectric 30 is provided in the lower and central region of the trench 5, the dielectric 30 insulating an electrically conductive filling 20 from the surrounding semiconductor substrate 1. A peripheral insulation collar 10 is provided in the upper and central region of the trench 5, the insulation collar 10 being sunk into the trench 5 to approximately the same level as the conductive filling 20. An exemplary material for the insulation collar 10 is silicon oxide, and polysilicon for the electrically conductive filling 20. However, other material combinations are also conceivable, of course.

Figure 3B:
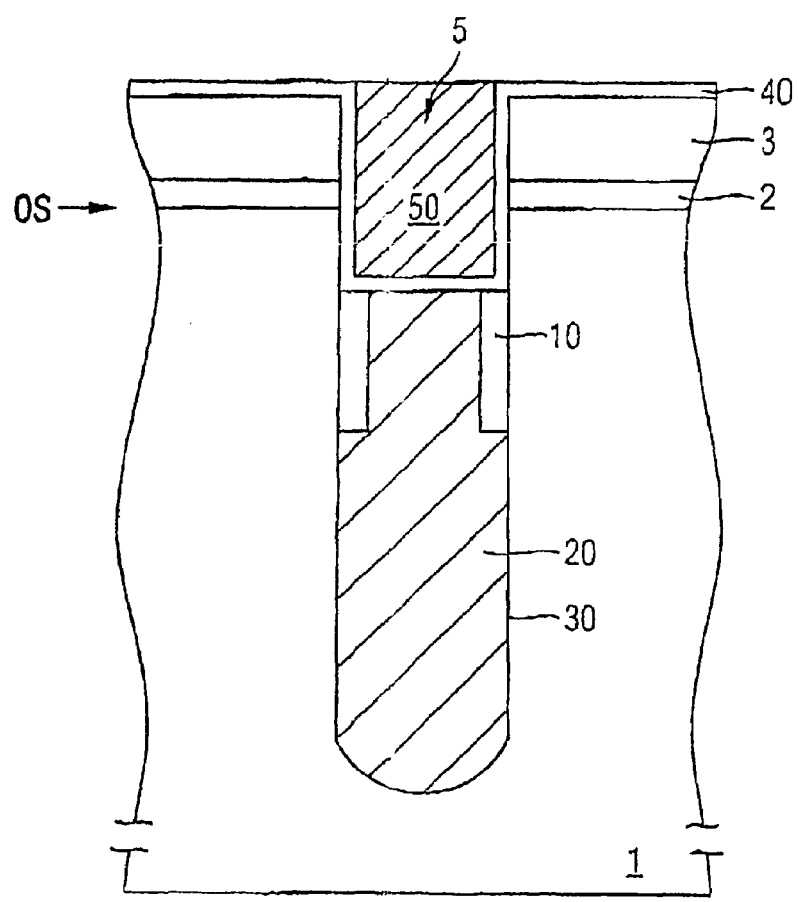

In accordance with FIG. 3B, firstly a liner layer 40 is deposited above the structure in accordance with FIG. 3A, which includes silicon nitride or silicon nitride/silicon oxide. The trench 5 is, thereupon, closed again with a polysilicon filling 50, for example, by deposition and subsequent chemical mechanical polishing.

In a subsequent process step, not illustrated in the figures, a hard mask is, then, formed above the structure in accordance with STI trenches to be formed that lie in parallel planes in front of and behind the plane of the drawing, whereupon the STI trenches are etched and filled (high-temperature process). Afterward, the hard mask for the STI trench formation is removed again.

The purpose of the advanced high-temperature step is to prevent the high-temperature step from having any influence later than the metallic buried contact that is, then, to be formed.

Figure 3C:
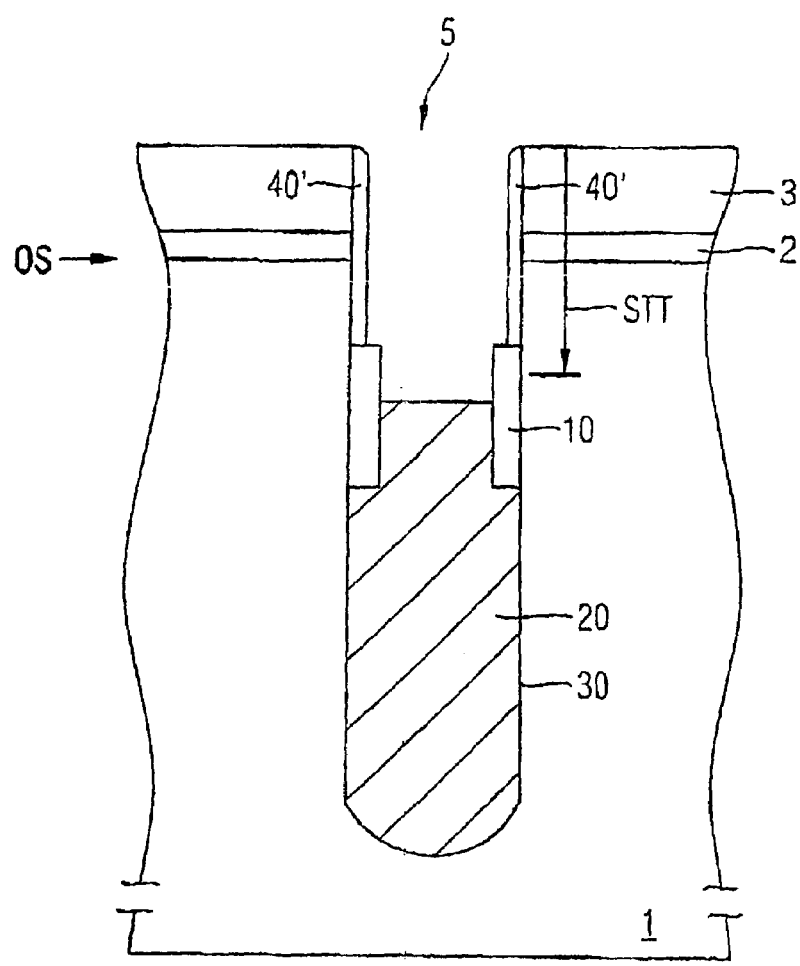

Furthermore, with reference to FIG. 3C, in which STT designates the STI trench depth, the polysilicon filling 50 is, then, removed by a wet etching, and the liner layer 40 made from silicon nitride is subjected to an anisotropic spacer etching in order to form liners 40'. As can be seen from FIG. 3C, during the etching-back of the polysilicon filling, the trench polysilicon filling 20 is also etched back to below the topside of the insulation collar 10, so that the STI trench depth STT lies between the topside of the insulation collar 10 and the topside of the trench polysilicon filling 20.

Figure 3D:
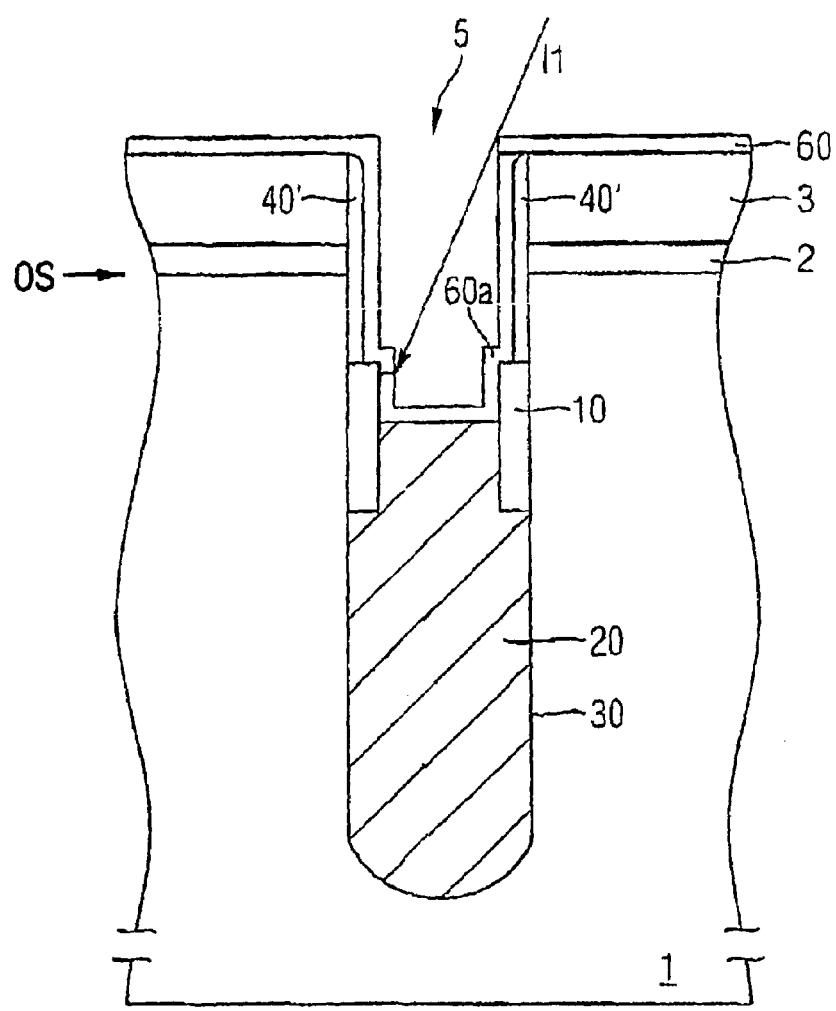

With reference to FIG. 3D, an amorphous silicon liner 60 is subsequently deposited over the resulting structure, into which boron ions are implanted by an oblique implantation I1, reference symbol 60a designating a region shaded from the implantation. The region 60a of the silicon liner 60 that is shaded from the implantation has a higher etching rate with regard to an $NH_4OH$ etching carried out as the next process step.

With reference to FIG. 3E, an $NH_4OH$ etching has the effect that the region 60a can be removed selectively with respect to the remaining, implanted region of the silicon liner 60.

In a subsequent process step, the uncovered region of the nitride layer 40' that is situated on the right-hand side of the FIG. is selectively etched in order to uncover the later contact region KS of the buried contact.

With reference to FIG. 3F, a conditioning implantation into the contact region KB is, then, effected, followed by deposition and etching-back of a conductive TiN filling 70 in order to form the buried contact. During the etching-back of the TiN filling 70, e.g. in a chlorine-containing plasma, the remaining silicon liner 60 is etched back as well.

Finally, the trench 5 is filled with an insulation cover 80 in a known manner, the insulation cover 80 being composed of silicon oxide, for example.

FIGS. 4A to 4E are diagrammatic illustrations of successive method stages of a fabrication method as second embodiment of the present invention.

The starting point of the second embodiment differs from the starting point of the first embodiment insofar as the trench 5 is filled with a polysilicon filling 50' without a liner being provided beforehand in the trench.

They, then, take place in the same way as already explained with reference to the first embodiment, and subsequently (not illustrated) formation of the hard mask body STI trenches, the etching and filling of the STI trenches, and the removal of the corresponding hard mask is carried out.

With reference to FIG. 4B, the polysilicon filling 50' is, then, removed and the underlying polysilicon filling 20 is etched back to below the topside of the insulation collar 10.

A first liner layer 42 made from silicon nitride and a second liner layer 62 made from amorphous silicon are, then, deposited. An oblique implantation I2 of boron ions into the liner layer 62 made from silicon is subsequently effected, a region 62a remaining shaded from the implantation I2. As already explained with reference to the first embodiment, the implantation I2 creates an etching selectivity of the shaded region 62a.

Figure 4A:
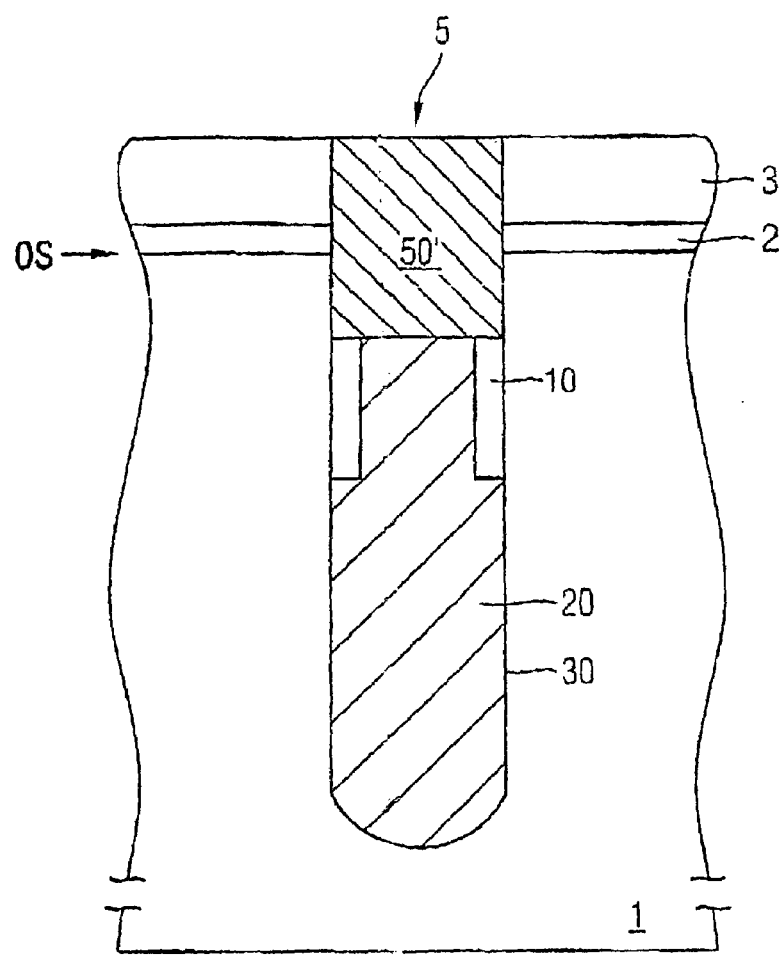
Figure 4C:
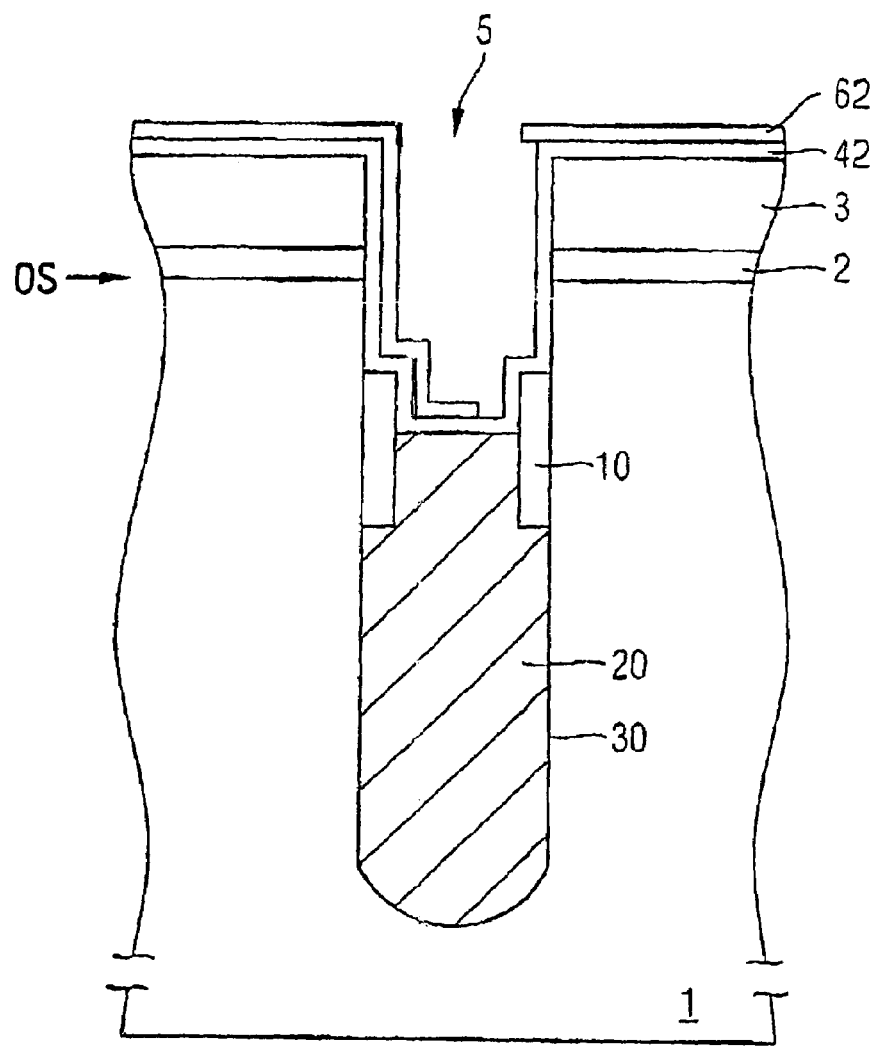

Accordingly, the region 62a, as shown in FIG. 4B, is removed by an $NH_4OH$ etching in the next process step shown in FIG. 4C. With reference to FIG. 4D, a spacer etching of the liner layer 62 made from silicon is, then, effected, followed by etching of the liner layer 42 made from silicon nitride, to uncover the later contact region KS of the buried contact with the substrate 1 and, at the same time, to leave the insulation region IS opposite. This results in the process state shown in FIG. 4D.

Figure 4E:
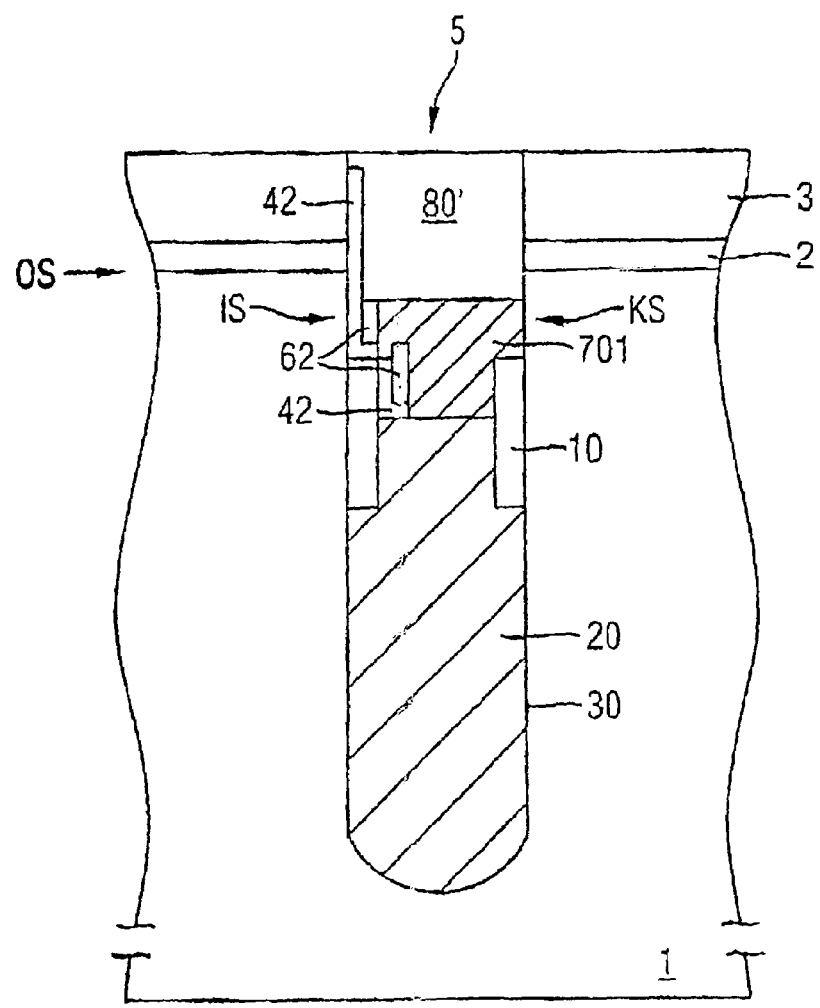

With reference to FIG. 4E, a conditioning of the contact region KB is, then, effected by a corresponding implantation, e.g. with arsenic, and, then, a filling with conductive Tin 70', which is etched back to form the buried contact. During the etching-back process, the liner layer 62 made from silicon is likewise etched back.

Finally, as in the case of the first embodiment, an insulation cover 80' made from silicon oxide is provided to close the trench 5.

Figure 5A:
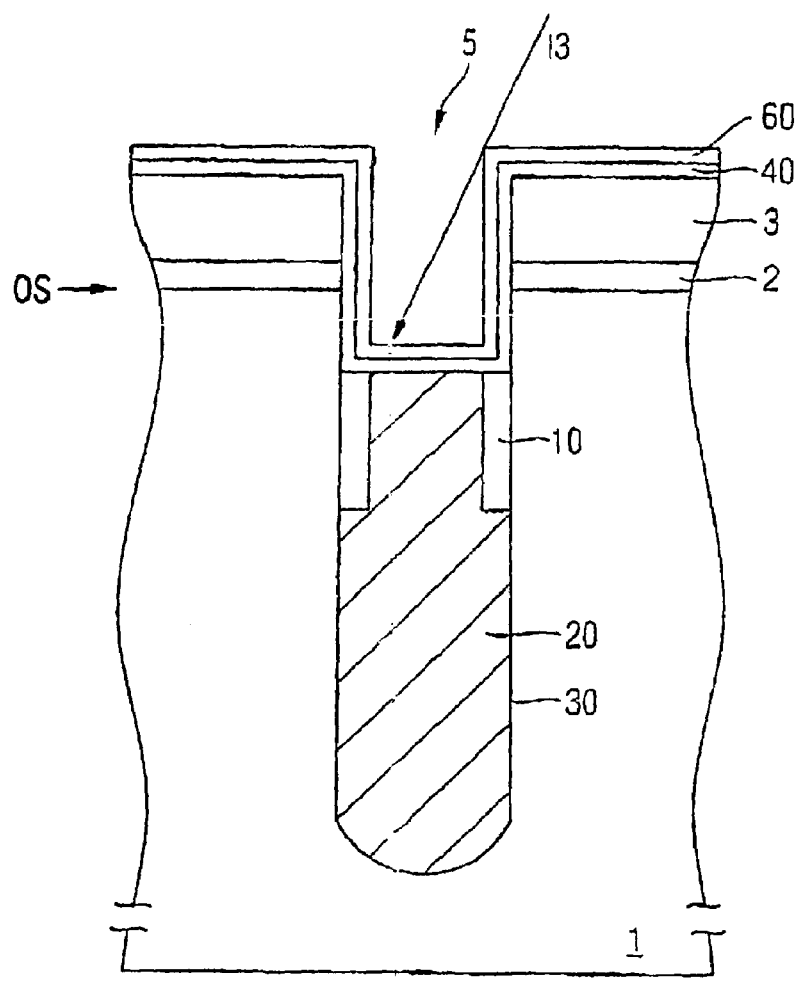
Figure 5B:
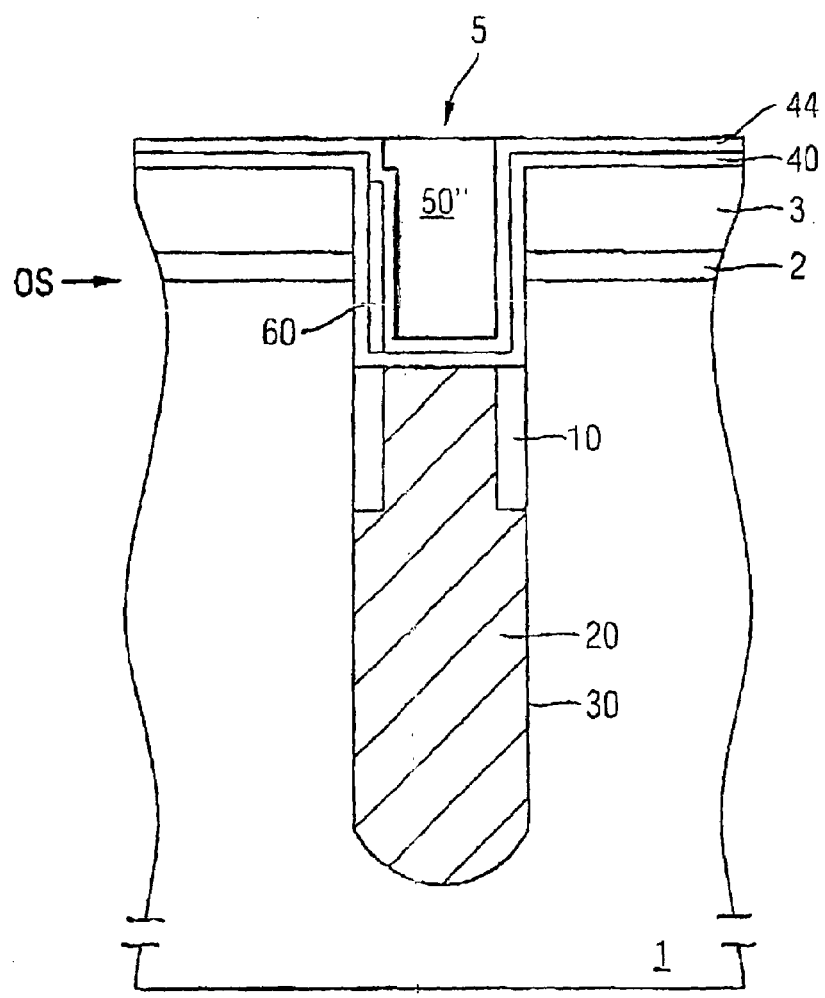

FIGS. 5A to 5C are diagrammatic illustrations of successive method stages of a third embodiment of the fabrication method of the present invention.

The starting point of the third embodiment in accordance with FIG. 5A is the same as that of the first embodiment, in which case, after the deposition of the liner layer 40 made from silicon nitride, a second liner layer 60 made from amorphous silicon is deposited directly above the liner layer 40.

This is followed by an anisotropic spacer etching of the silicon liner layer 60 and the deposition of a further liner layer 44 made from silicon nitride. Finally, the trench 5 is filled again with a polysilicon filling 50'', which results in the process stage shown in FIG. 5B.

In the further course of the process, the STI trench process is effected, as already explained thoroughly in connection with the first and second embodiments, and then the polysilicon filling 50'' and the uncovered regions of the silicon nitride liner 40 are removed.

Afterward, the polysilicon filling 20 is etched back to below the topside of the insulation collar 10. This is followed by the deposition and etching-back of a conductive TiN filling 70'' to form the buried contact. As in the other embodiments described previously, the trench 5 is, then, closed again by an insulation cover 80'' made from silicon oxide.

In this embodiment, too, it is possible, moreover, to effect a conditioning implantation into the contact region KS prior to the filling with TiN.

FIGS. 6A to 6D are diagrammatic illustrations of successive method stages of a fourth embodiment of the fabrication method of the present invention.

In contrast to the embodiments described previously, the fourth embodiment in accordance with FIG. 6A commences in a process stage in which the insulation collar 10 has not yet been sunk into the trench 5, as illustrated in FIG. 6A.

After the process state illustrated in FIG. 6A, the STI isolation trench forming process is, then, carried out as already explained above in connection with the other embodiments.

Figure 6B:
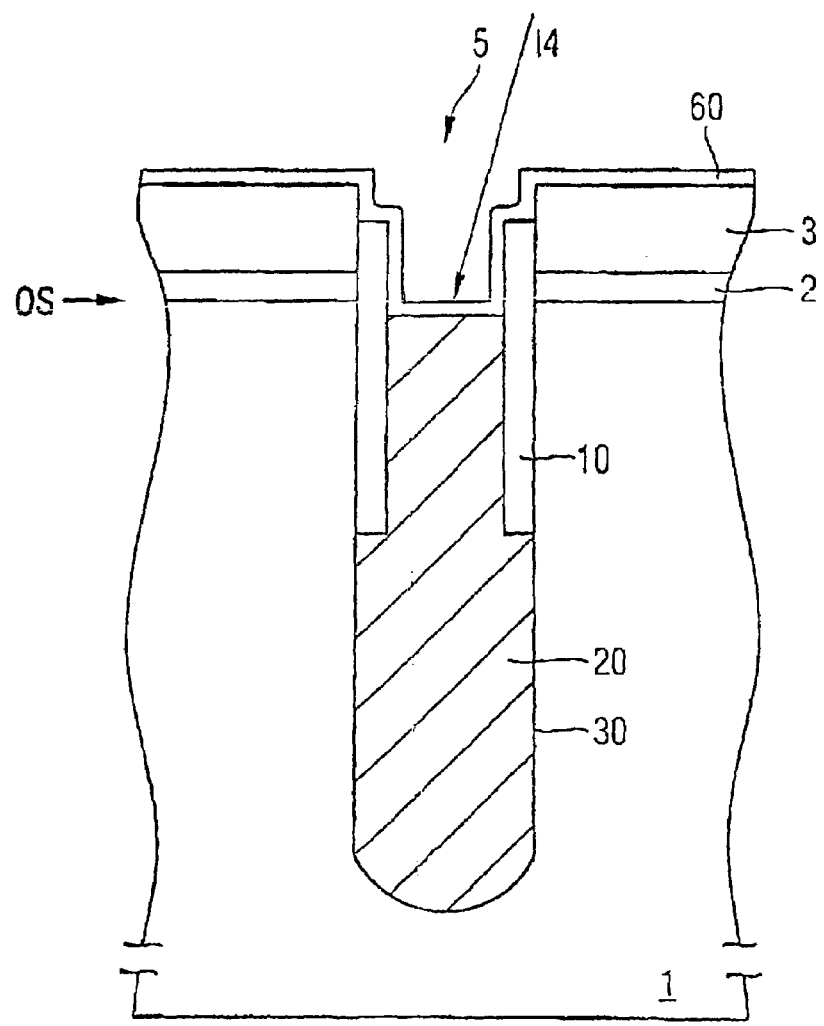

In accordance with FIG. 6B, the polysilicon filling 20 is, then, sunk to below the topside of the substrate OS.

A liner layer 60 made from silicon is, subsequently, deposited over the resulting structure. In this embodiment, too, an oblique implantation I4 with boron ions is, then, effected in the trench 5, a region 60a of the silicon liner 60 remaining shaded, as illustrated in FIG. 6B.

Figure 6C:
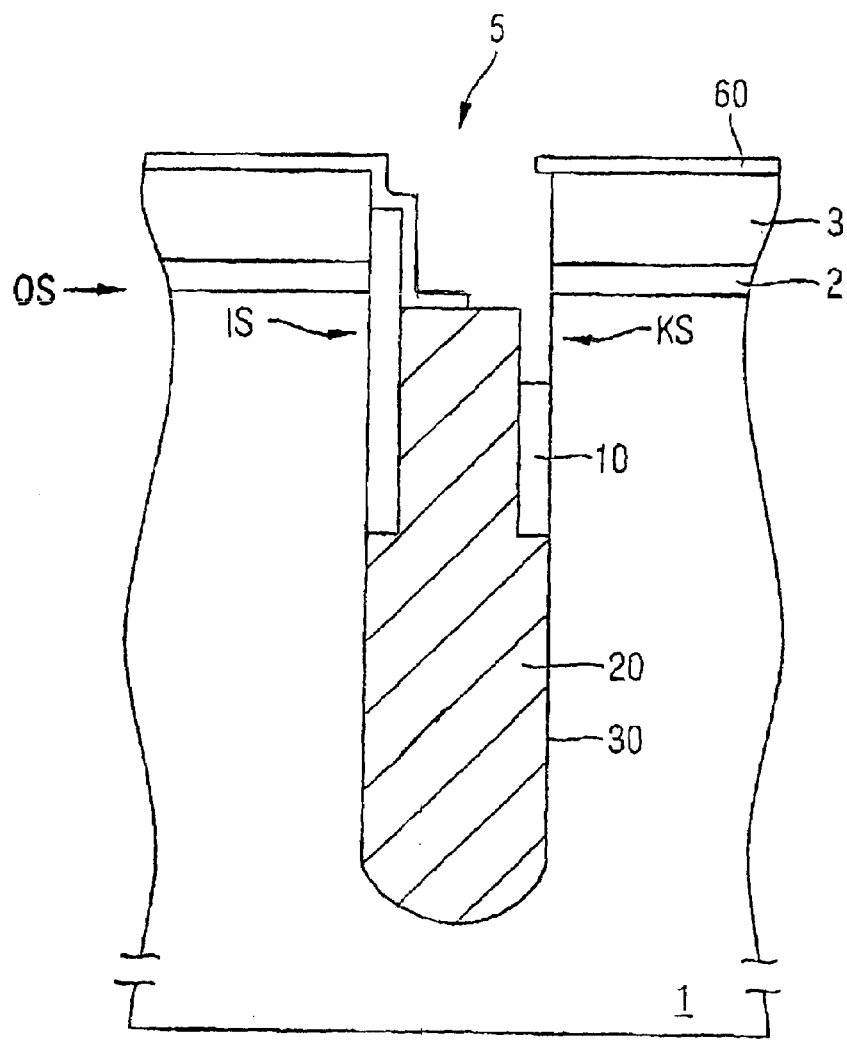
Figure 6D:
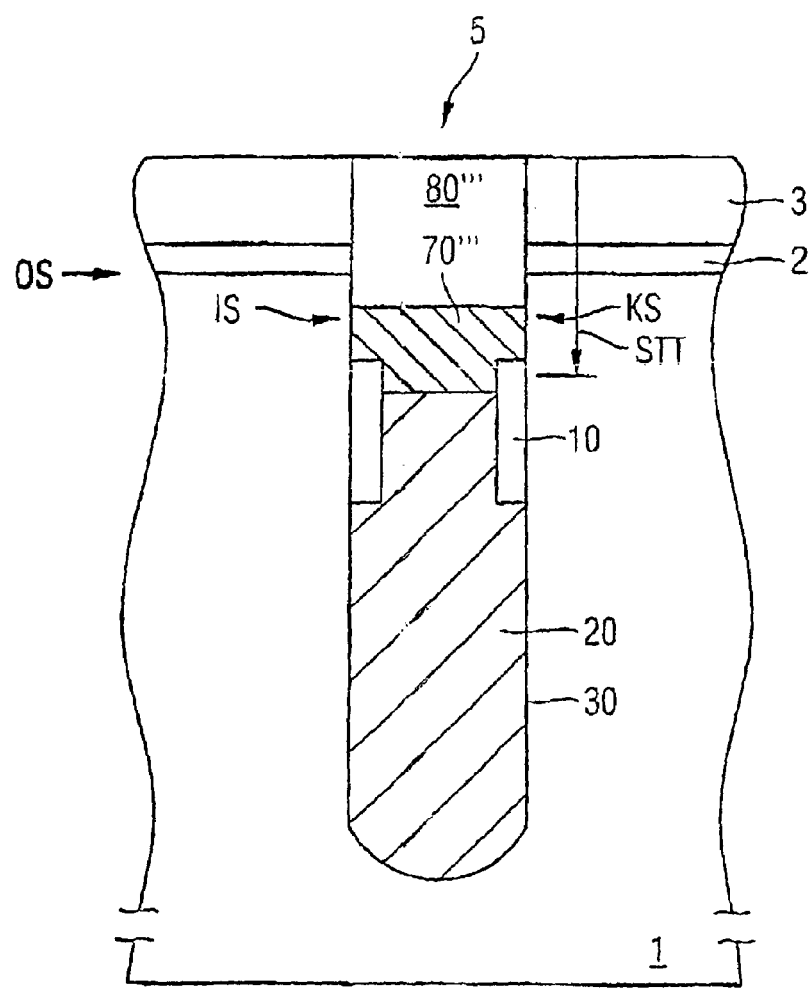

Furthermore, with reference to FIG. 6C, the region 60a is, then, selectively etched in $Na_4OH$ followed by selective removal of the insulation collar 10 in the later contact region KB of the buried contact.

An etching is effected subsequently, during which the remaining liner 60 is removed, and, then, the polysilicon filling 20 is sunk further to below the insulation collar on the right-hand side of the figure. Afterward, as already described above, the trench is filled with TiN and the TiN filling 70''' is etched back to produce the buried contact. Likewise, in exactly the same way as in the embodiments described previously, the trench 5 is, then, closed again that an insulation cover 80''' made from a silicon oxide.

Although the present invention has been described above on the basis of preferred exemplary embodiments, it is not restricted thereto, but rather can be modified in diverse ways.

In particular, the selection of the layer materials is only by way of example and can be varied in many different ways.

This application claims the priority, under 35 U.S.C. § 119, of German patent application No. 103 34 547.7, filed Jul. 29, 2003; the entire disclosure of the prior application is herewith incorporated by reference.

We claim:

1. A method for fabricating a trench capacitor in a substrate, which comprises:
   providing a trench with trench walls in the substrate utilizing a hard mask with a corresponding mask opening, the trench having the lower, central, and upper trench regions;
   providing a capacitor dielectric in the lower and central trench regions;
   providing an insulation collar in the central and upper trench regions, the insulation collar having a topside;
   providing an electrically conductive filling at least as far as the topside of the insulation collar;
   subsequently depositing a nitride liner layer;
   subsequently completely filling the trench with a filling material;
   carrying out an STI trench fabrication process;
   removing the filling material and sinking the electrically conductive filling to below the topside of the insulation collar;
   subsequently forming spacers at the trench walls above the insulation collar;
   removing portions of the spacers disposed above the connection region;
   forming an insulation region on a first side with respect to the substrate above the insulation collar;
   masking at least one portion of the spacers disposed above the insulation region with a silicon liner;
   uncovering a connection region on a different side with respect to the substrate above the insulation collar; and
   forming a buried contact electrically connecting the filling of the trench to the substrate on one side of the trench by depositing and etching back a metallic filling.

2. The method according to claim 1, wherein the substrate has a topside and which further comprises after etching back the metallic filling, providing an insulation cover in the upper trench region at least as far as the topside of the substrate.

3. The method according to claim 1, wherein the hard mask has a topside and the substrate has a topside, and which further comprises:
   carrying out the tilling step by providing the filling as far as the topside of the hard mask; and
   providing the insulation collar as far as above the topside of the substrate.

4. The method according to claim 1, which further comprises providing the metallic filling from TiN.

5. The method according to claim 1, wherein the metallici tilling is of TiN.

6. The method according to claim 1, which further comprises;
providing a semiconductor memory cell having a planar selection transistor in the substrate; and
electrically connecting the burled contact to the selection transistor.

7. The method according to claim 1, which further comprises;
providing a semiconductor memory cell having a planar selection transistor in the substrate; and
electrically connecting the buried contact to the memory cell.

8. The method according to claim 1, which further comprises;
providing a plurality of semiconductor memory cells each having a planar selection transistor in the substrate;
providing a plurality of the trench capacitor in the substrate to form a trench capacitor array; and
electrically connecting each buried contact of a trench capacitor to one of the memory cells.

9. A method for fabricating a trench capacitor in a substrate, which comprises:
providing a trench in the substrate utilizing a hard mask with a corresponding mask opening, the trench having the lower, central, and upper trench regions;
providing a capacitor dielectric in the lower and central trench regions;
providing an insulation collar in the central and upper trench regions, the insulation collar having a topside;
providing an electrically conductive filling as far as the topside of the insulation collar;
subsequently filling the trench completely with a filling material;
carrying out an STI trench fabrication process;
removing the filling material and sinking the electrically conductive filling to below the topside of the insulation collar;
subsequently depositing a nitride liner layer and a silicon liner layer;
forming an insulation region on a first side with respect to the substrate above the insulation collar;
subsequently forming a spacer from the silicon liner layer above the nitride liner layer in the insulation region;
removing the nitride liner layer disposed above the connection region;
masking the nitride liner layer disposed above the insulation region with the spacer made from the silicon liner layer;
uncovering a connection region on a different side with respect to the substrate above the insulation collar; and
forming a buried contact electrically connecting the filling of the trench to the substrate on one side of the trench by depositing and etching back a metallic filling.

10. A method for fabricating a trench capacitor in a substrate, which comprises:
providing a trench in the substrate utilizing a hard mask with a corresponding mask opening, the trench having the lower, central, and upper trench regions;
providing a capacitor dielectric in the lower and central trench regions;
providing an insulation collar in the central and upper trench regions, the insulation collar having a topside;
providing an electrically conductive filling as far as the topside of the insulation collar;
forming an insulation region on a first side with respect to the substrate above the insulation collar;
subsequently depositing a nitride liner layer;
subsequently depositing a first silicon liner layer;
subsequently forming a spacer from the silicon liner layer in the insulation region;
subsequently depositing a second nitride liner layer; and
subsequently filling the trench completely with the filling material;
carrying out an STI trench fabrication process;
removing the filling material and sinking the electrically conductive filling to below the topside of the insulation collar;
uncovering a connection region on a different side with respect to the substrate above the insulation collar; and
forming a buried contact electrically connecting the filling of the trench to the substrate on one side of the trench by depositing and etching back a metallic filling.

11. The method according to claim 10, which further comprises, after removing the filling material, removing the first and second nitride liner layers apart from a region masked by the spacer made from the silicon liner layer.

12. The method according to claim 10, wherein the substrate has a topside, and which further comprises:
removing the filling material as far as the topside of the substrate;
subsequently depositing a silicon liner layer and removing the silicon liner layer on a side of the contact region;
subsequently sinking at least a part of the insulation collar in the upper trench region, the sunken part having a topside; and
subsequently sinking the filling to below the topside of the sunken part of the insulation collar.

13. The method according to claim 10, wherein the substrate has a topside, and which further comprises:
removing the filling as far as the topside of the substrate;
subsequently depositing a silicon liner layer and removing the silicon liner layer on a side of the contact region;
subsequently sinking at least a part of the insulation collar in the upper trench region, the sunken part having a topside; and
subsequently sinking the filling to below the topside of the sunken part of the insulation collar.

* * * * *